(12) United States Patent
Kato (10) Patent No.: US 9,882,168 B2
(45) Date of Patent: Jan. 30, 2018

(54) ORGANIC ELECTROLUMINESCENCE DISPLAY DEVICE

(71) Applicant: Japan Display Inc., Tokyo (JP)

(72) Inventor: Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/375,361

(22) Filed: Dec. 12, 2016

(65) Prior Publication Data

US 2017/0271620 A1    Sep. 21, 2017

(30) Foreign Application Priority Data

Mar. 18, 2016  (JP) ................................ 2016-055276

(51) Int. Cl.
| | | |
|---|---|---|
| *H01L 51/52* | (2006.01) | |
| *H01L 51/56* | (2006.01) | |
| *H01L 51/10* | (2006.01) | |
| *H01L 51/44* | (2006.01) | |

(52) U.S. Cl.
CPC ...... *H01L 51/5259* (2013.01); *H01L 51/5253* (2013.01); *H01L 51/56* (2013.01); *H01L 51/10* (2013.01); *H01L 51/102* (2013.01); *H01L 51/107* (2013.01); *H01L 51/448* (2013.01); *H01L 51/5237* (2013.01); *H01L 51/5243* (2013.01); *H01L 51/5256* (2013.01)

(58) Field of Classification Search
CPC ..... H01L 51/10; H01L 51/102; H01L 51/107; H01L 51/448; H01L 51/5237; H01L 51/5243; H01L 51/5253; H01L 51/5256; H01L 51/5259; H01L 51/5156; H01L 51/5218; H01L 51/5215; H01L 51/5212; H01L 51/5206; H01L 51/5203
See application file for complete search history.

(56) References Cited

U.S. PATENT DOCUMENTS

| | | | |
|---|---|---|---|
| 2005/0242720 A1* | 11/2005 | Sano | .................... H01L 51/5259 313/506 |
| 2007/0009762 A1* | 1/2007 | Hamada | ................. C09K 11/06 428/690 |
| 2010/0295759 A1* | 11/2010 | Tanaka | ................ H01L 51/5259 345/76 |
| 2012/0228648 A1* | 9/2012 | Mitsuya | .............. H01L 51/5044 257/88 |

FOREIGN PATENT DOCUMENTS

| | | |
|---|---|---|
| JP | 2002-008852 A | 1/2002 |
| JP | 2006-080094 A | 3/2006 |
| JP | 2010-272270 A | 12/2010 |
| JP | 2012-079658 A | 4/2012 |

* cited by examiner

*Primary Examiner* — Ermias Woldegeorgis
(74) *Attorney, Agent, or Firm* — Typha IP LLC (57) ABSTRACT

Provided is a display device including a substrate having a first region and a second region adjacent to the first region. The second region is located in a direction from the first region to an outside of the substrate. The first region possesses a transistor, a leveling film over the transistor, and a light-emitting element over the leveling film and electrically connected to the transistor. The display device further includes a plurality of metal films in the second region and a sealing film. The plurality of metal films includes at least one of Group 1 metal elements and Group 2 elements, and the leveling film is arranged so as to be confined in the first region.

17 Claims, 12 Drawing Sheets

ORGANIC ELECTROLUMINESCENCE DISPLAY DEVICE

CROSS REFERENCE TO RELATED APPLICATIONS

This application is based on and claims the benefit of priority from the prior Japanese Patent Application No. 2016-055276, filed on Mar. 18, 2016, the entire contents of which are incorporated herein by reference.

FIELD

This invention relates to a display device, for example, an EL display device and a manufacturing method thereof.

BACKGROUND

As an example of a display device, an organic EL (electroluminescence) display device is represented. An organic EL display device possesses a light-emitting element in each pixel, and a light-emitting element has a layer (hereinafter, referred to as an EL layer) between a pair of electrodes. A light-emitting element is driven by supplying current between a pair of electrodes. During operation of a light-emitting element, the organic compound is oxidized or reduced with the current flowing in the light-emitting element to be transformed into a state having an electric charge. Furthermore, an excited state is generated by recombination of these active species. Such active species readily react with other organic compounds or impurities such as water and oxygen, which enter the light-emitting element, due to their higher reactivity than that of a molecule in an electrically neutral state or a ground state. The reaction with the impurities adversely influences performance of a light-emitting element, resulting in reduction of efficiency and lifetime. The reduction in emission efficiency finally inhibits emission to be obtained, and a pixel from which emission cannot be obtained is recognized as a black spot (dark spot) during operation of a display device.

Since a light-emitting element of an organic EL display device is sealed with a pair of substrates, the impurities mainly enter from an edge portion of a display device. Influence of the impurities cannot be found immediately after manufacture, and the influence of the impurities may appear after a few days or a few months. In such a case, a display defect may occur a little while after shipment even in the case of a display device which is recognized as a quality item when manufactured.

With respect to such a problem, a technique is disclosed in Japanese patent application publications No. 2010-272270 and 2012-79658 for detecting the entrance of the impurities at an early stage. As another solution, a method is disclosed in which, although the entrance of the impurities cannot always be detected, the impurities entering a display device are trapped to suppress reduction of performance (see, Japanese patent application publications No. 2002-8852 and 2006-80094).

SUMMARY

An embodiment of the present invention is a display device. The display device includes a substrate having a first region and a second region adjacent to the first region. The second region is located in a direction from the first region to an outside of the substrate. The first region possesses a transistor, a leveling film over the transistor, and a light-emitting element which is located over the leveling film and is electrically connected to the transistor. The display device further includes a plurality of metal films in the second region and a sealing film. The sealing film is located over the light-emitting element and the plurality of metal films and contains a first layer including an inorganic compound, a second layer located over the first layer and including an organic compound, and a third layer located over the second layer and including an inorganic compound. The plurality of metal films includes at least one of Group 1 metal elements and Group 2 elements, and the leveling film is arranged so as to be confined in the first region.

An embodiment of the present invention is a display device. The display device includes a substrate having a first region and a second region adjacent to the first region. The second region is located in a direction from the first region to an outside of the substrate. The first region possesses a transistor, a leveling film over the transistor, and a light-emitting element which is located over the leveling film and is electrically connected to the transistor. The display device further includes a first layer located over the light-emitting element and the second region and including an inorganic compound, a plurality of metal films located over the first layer in the second region, a second layer located over the first layer and the plurality of metal films and including an organic compound, and a third layer located over the second layer and including an inorganic compound. The plurality of metal films includes at least one of Group 1 metal elements and Group 2 elements, and the leveling film is arranged so as to be confined in the first region.

DESCRIPTION OF EMBODIMENTS

Hereinafter, the embodiments of the present invention are explained with reference to the drawings. However, the invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

First Embodiment

In the present embodiment, a display device 100 according to an embodiment of the present invention is explained by using FIG. 1 to FIG. 3C.

1. Plane Structure

Figure 1:
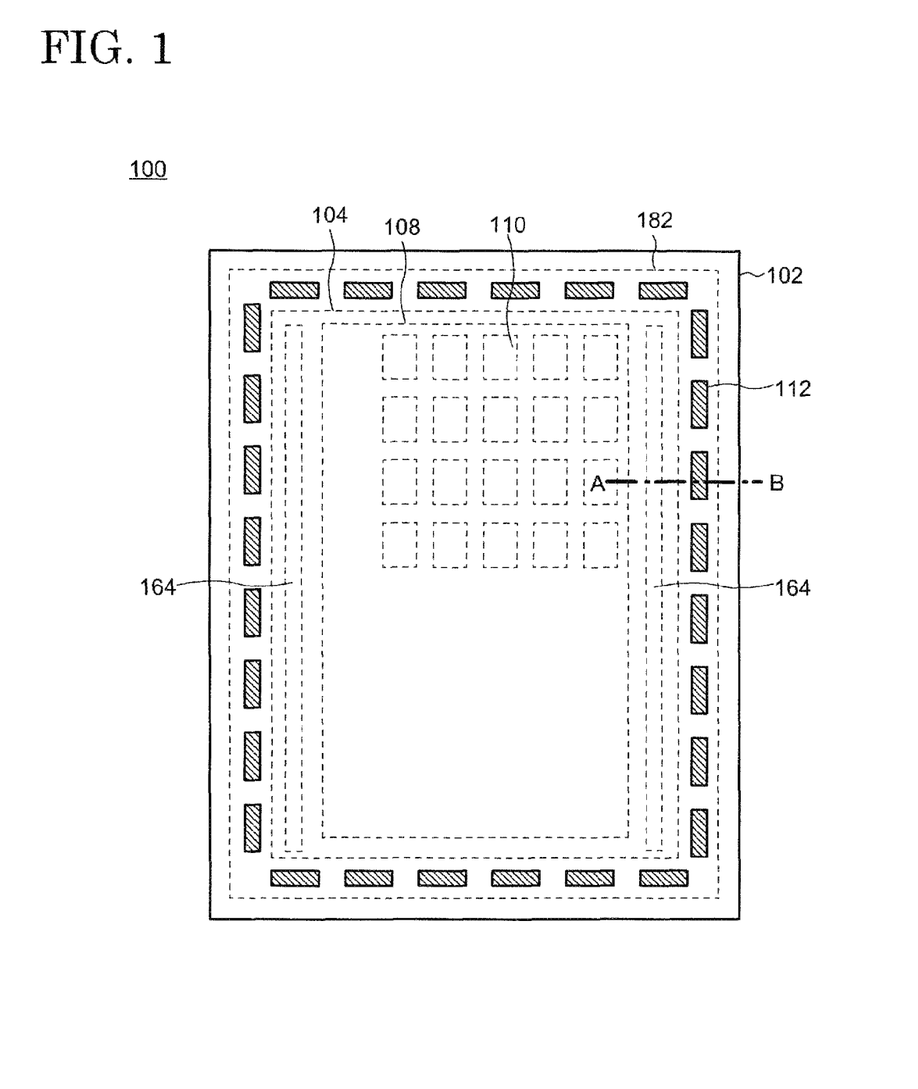
FIG. 1 is a schematic top view of a display device according to an embodiment.

A top view of the display device 100 is shown in FIG. 1. The display device 100 has a first region 104 and a second region (106, see FIG. 2) on one surface (top surface) of a substrate 102, where the second region 106 is adjacent to the first region 104 in a direction from the first region 104 to the outside of the substrate 102. The second region 106 is adjacent to and surrounds the first region 104.

The first region 104 includes a display region 108 which possesses a plurality of pixels 110. A display element such as a light-emitting element can be disposed in the pixels 110, and arrangement of the pixels 110 with different emission colors enables full-color display. For example, a plurality of pixels 110 each having a red-emissive light-emitting element, a plurality of pixels 110 each having a green-emissive light-emitting element, and a plurality of pixels 110 each having a blue-emissive light-emitting element can be arranged. Alternatively, full-color display may be conducted by using white-emissive light-emitting elements in all of the pixels 110 and extracting red, green, or blue color from the respective pixels 110 with a color filter. The colors finally extracted are not limited to a combination of red, green, and blue colors. For example, four colors of red, green, blue, and white can be extracted by forming the pixels 110 giving four different colors.

In FIG. 1, the pixel 110 is illustrated so as to have a rectangular shape. However, an embodiment of the present invention is not limited thereto, and the shape of the pixel 110 may be square or polygonal. There is also no limitation to the arrangement of the pixels 110, and a stripe arrangement, a delta arrangement, a Pentile arrangement, and the like can be employed. Although not shown in FIG. 1, a driver circuit for controlling light emission of each pixel 110 may be formed in the first region 104. Alternatively, the light emission of the pixels 110 may be controlled by connecting a driver circuit formed over another substrate to the first region 104.

Power source lines 164 are provided to the display device 100 so as to sandwich the display region 108. The power source lines 164 are electrically connected to a second electrode 176 of the light-emitting element 126 described below and are formed to give a constant voltage to the second electrode 176.

A plurality of metal films 112 is further disposed in the second region 106 of the display device 100. As shown in FIG. 1, the plurality of metal films 112 may be arranged to form an outline surrounding the first region 104. In FIG. 1, the plurality of metal films is arranged so as to form a rectangular outline. Each of the plurality of metal films 112 is a film including a 0-valent metal as a main component. The metal films 112 may contain a Group 1 or Group 2 metal element of the periodic table, and a Group 2 metal element such as calcium, magnesium, and barium is preferably represented. A metal element other than the Group 1 or Group 2 elements may be included in the metal films 112, and silver or aluminum may be contained, for example.

2. Cross-Sectional Structure

Figure 2:
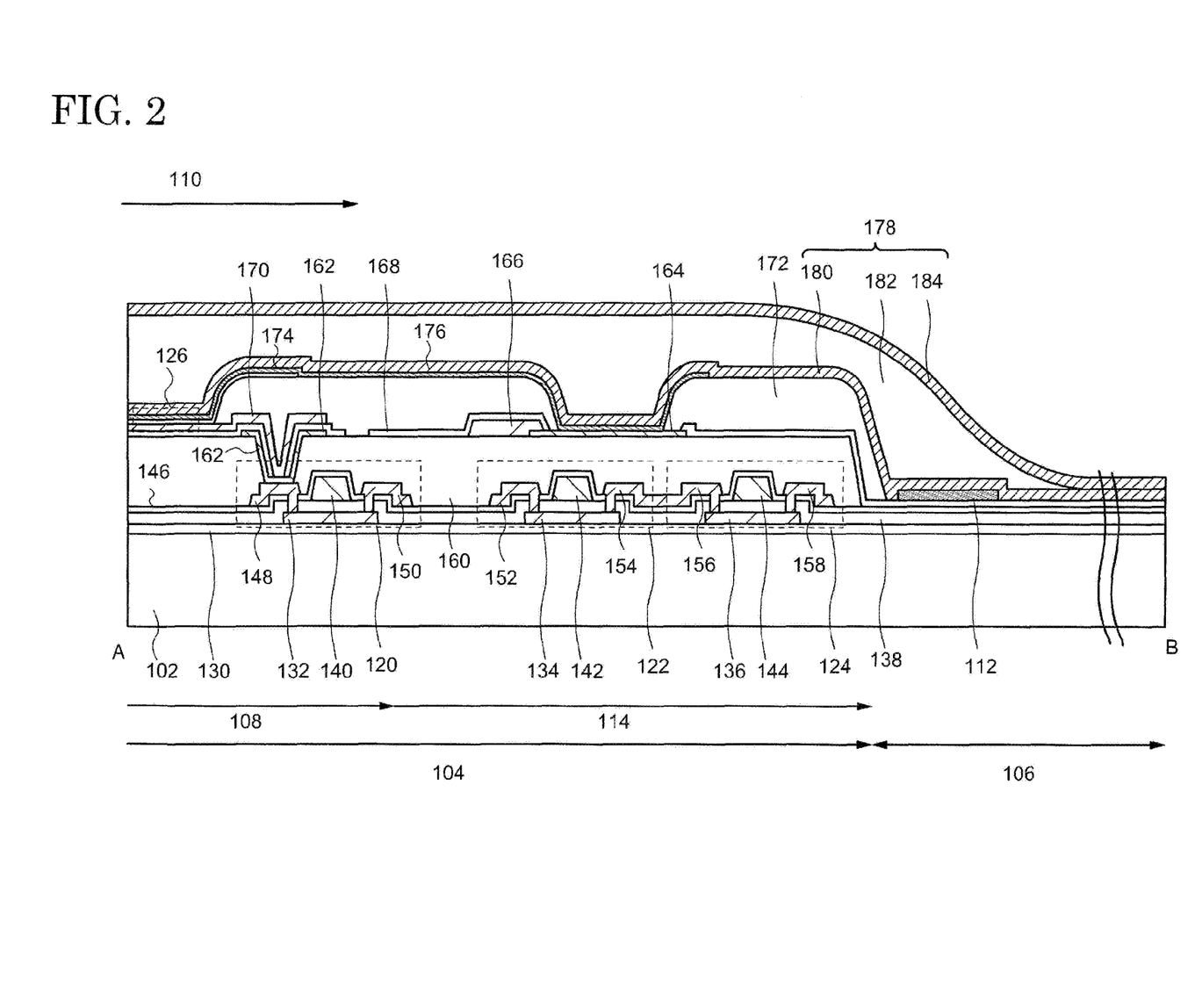
FIG. 2 is a schematic cross-sectional view of a display device according to an embodiment.

A schematic cross-sectional view along dashed line A-B shown in FIG. 1 is shown in FIG. 2. FIG. 2 is a schematic drawing showing a cross-sectional structure of a part of the pixel 110 which is the closest to the power source line 164 and a periphery thereof. The display device 100 has the first region 104 and the second region 106 over the substrate 102 and further possesses a driver circuit region 114 between the display region 108 and the second region 106. An undercoat 130 is provided over the substrate 102.

A transistor 120 and the light-emitting element 126 electrically connected thereto are disposed in the pixels 110 included in the display region 108. Although not shown, each pixel 110 may additionally possess one or more transistors and an element other than a transistor, such as a capacitor element. In FIG. 2, the transistor 120 has a top-gate structure. However, the present embodiment is not limited to this mode, and the transistor 120 may have a bottom-gate structure, and a polarity of the transistor 120 may be any of a P-type and an N-type. The transistor 120 is configured by a semiconductor film 132, a gate insulating film 138, a gate electrode 140, source/drain electrodes 148 and 150, and the like.

The driver circuit having transistors 122 and 124 and the like is provided in the driver circuit region 114, and the power source line 164 is disposed so as to overlap with the driver circuit region 114. Similar to the pixel 110, there is also no limitation to the structure of the transistors 122 and 124 provided in the driver circuit region 114, and the structure shown in FIG. 2 is just an example. The power source line 164 may not overlap with the driver circuit region 114. The transistor 122 is configured by a semiconductor film 134, the gate insulating film 138, a gate electrode 142, source/drain electrodes 152 and 154, and the like. Similarly, the transistor 124 is configured by a semiconductor film 136, the gate insulating film 138, a gate electrode 144, source/drain electrodes 156 and 158, and the like. In FIG. 2, an example is demonstrated in which the source/drain electrodes 154 and 156 are connected to each other.

The plurality of metal layers 112 is arranged in the second region 106. As described above, the metal films 112 can be arranged so as to form the outline surrounding the first region 104.

An interlayer film 146 and a leveling film 160 are provided over the transistor 120 in the display region 108 and the transistors 122 and 124 in the driver circuit region 114. The interlayer film 146 is disposed in order to protect the transistors 120, 122, and 124. The leveling film 160 is a film which absorbs depressions, projections, and slopes caused by the elements such as the transistors 120, 122, and 124 and a capacitor element and gives a flat top surface. The interlayer film 146 and the leveling film 160 are each an insulating film. As shown in FIG. 2, the leveling film 160 may not be provided in the region in which the plurality of metal films 112 are formed so that the interlayer film 146 is exposed from the leveling film 160. In this case, the leveling film 160 is arranged so as to be confined in the first region 104. In other words, the leveling film 160 is arranged to be confined in the outline formed by the plurality of metal films 112 and does not overlap with the metal films 112.

A first electrode 170 of the light-emitting element 126 and the transistor 120 are electrically connected in an opening portion provided in the leveling film 160. In the example shown in FIG. 2, a connection electrode 162 is formed in the opening portion, and the first electrode 170 is electrically connected to the source/drain electrode 148 of the transistor 120 via the connection electrode 162.

The power source line 164 is further disposed over the leveling film 160. The power source line 164 can be formed simultaneously with the connection electrode 162. Hence, the power source line 164 and the connection electrode 162 can exist in the same layer. Note that, when the power source line 164 is prepared with a material having a relatively high resistance, an auxiliary electrode 166 over and electrically connected to the power source line 164 may be provided as an optional structure in order to compensate conductivity thereof.

As an optional structure, a protection film 168 which is an insulating film may be formed over the leveling film 160, the connection electrode 162, and the power source line 164. In the example shown in FIG. 2, the protection film 168 is arranged so as to be in contact with a side surface and a top surface of the connection electrode 162, an edge portion of the power source line 164, the leveling film 160, and the interlayer film 146.

An edge portion of the first electrode 170, the edge portion of the power source line 164, and the opening portion used for the connection between the light-emitting element 126 and the transistor 120 is covered by an insulating film (hereinafter, referred to as a partition wall) 172. Although not shown, the partition wall 172 covers the peripheral edge of the first electrode 170. Therefore, the partition wall 172 is an insulating film having an opening portion which overlaps with the first electrode 170. A thickness of the partition wall 172 is, for example, equal to or larger than 0.2 µm and equal to or smaller than 3 µm or equal to or larger than 0.5 µm and equal to or smaller than 2 µm, and a typical thickness is approximately 1 µm.

An EL layer 174 is formed over the first electrode 170 and the partition wall 172, over which the second electrode 176 is provided. In the present specification and claims, an EL layer means the whole of the layers provided between a pair of electrodes, structured with one or a plurality of layers including an organic compound, and undergoes recombination of holes and electrons injected from the pair of electrodes. In FIG. 2, an example is shown in which the EL layer 174 is structured with a single layer. However, the EL layer 174 may be structured by using a plurality of organic layers exemplified by a carrier-injection layer, a carrier-transporting layer, an emission layer, a carrier-blocking layer, an exciton-blocking layer, and the like as appropriate. Moreover, the structure of the EL layer 174 may be different between the adjacent pixels 110.

The metal films 112 is arranged in the second region 106. As shown in FIG. 2, the metal films 112 can be formed so as not to overlap with the leveling film 160. Therefore, when the protection film 168 is formed, the metal films 112 contact with the protection film 168. As described below, when the protection film 168 is not disposed, the metal films contact with the interlayer film 146 formed over the gate electrodes 140, 142, and 144 of the transistors 120, 122, and 124.

The second electrode 176 and the metal films 112 can be formed simultaneously. Therefore, the second electrode 176 and the metal films 112 can exist in the same layer, by which an increase of a load of the manufacturing process can be prevented.

A passivation film 178 is formed over the second electrode 176 and the metal films 112. The passivation film 178 includes a first layer 180, a second layer 182, and a third layer 184.

The first layer 180 preferably contains an inorganic compound, and the inorganic compound preferably includes silicon. As a silicon-containing inorganic compound, silicon oxide, silicon nitride, silicon oxynitride, silicon nitride oxide, and the like are represented. As shown in FIG. 2, the first layer 180 is in contact with the second electrode 176 and the metal films 112. Furthermore, although not shown, the first layer 180 can be formed so as to extend over the plurality of adjacent pixels 110. The first layer 180 has a slope (in other words, projections and depressions) on its surface due to the partition wall 172 where the projections overlap with the partition wall 172, and the depressions are located between two projections (e.g., over the light-emitting element 126 or over the power source line 164).

The second layer 182 is placed over the first layer 180 and formed so as to extend from the first region 104 to the second region 106. The second layer 182 preferably contains an organic compound. As an organic compound, a polymer material typified by a resin is represented. A polymer material may have a linear structure or be cross-linked to exist in a three-dimensional network state. As a polymer material, an epoxy resin, an acrylic resin, a polyimide, a polyamide, a polycarbonate, a polysiloxane, and the like are given. It is preferred that the second layer 182 include a material having a high transmittance with respect to visible light.

As shown in FIG. 2, the second layer 182 possesses a flat top surface in a region overlapping with the light-emitting element 126 and the partition wall 172 in the display region 108. That is, the second layer 182 covers the partition wall 172, absorbs the depressions and projections caused by the partition wall 172, and has a flat top surface over the light-emitting element 126 and the partition wall 172. It is preferred that the second layer 182 possess a thickness of 1 µm or more. For example, the thickness is equal to or larger than 1 µm and equal to or smaller than 20 µm, equal to or larger than 2 µm and equal to or smaller than 15 µm, or equal to or larger than 5 µm and equal to or smaller than 15 µm, and a typical thickness is approximately 10 µm. Note that the top surface of the second layer 182 slopes from the first region 104 to the second region 106, and the thickness thereof decreases with decreasing distance to the second region 106.

The third layer 184 is provided over the second layer 182. The third layer 184 can be formed with a material usable for the first layer 180 by using a method applicable for the first layer 180. The first layer 180 and the third layer 184 can include the same material. It is preferred that at least one of the first layer 180 and the third layer 184 include silicon nitride. As shown in FIG. 2, the third layer 184 is formed so as to continue from the display region 108 to the second region 106. Furthermore, the first layer 180 and the third layer may be in contact with each other in the second region 106.

As described above, the second layer 182 has a substantially flat top surface in the first region 104. Hence, the third layer 184 with a small number of pinholes and a uniform thickness can be fabricated, by which entrance of the impurities can be effectively prevented.

3. Entrance of Impurities

Figure 3A:
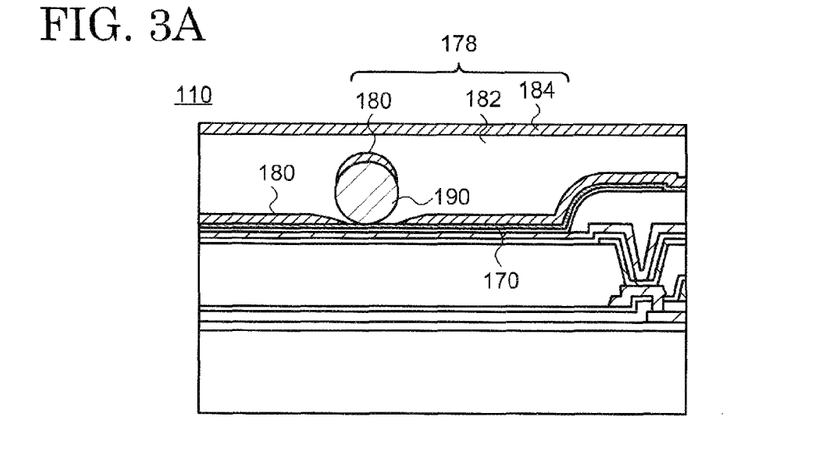
FIG. 3A to FIG. 3C are schematic cross-sectional views of a display device according to an embodiment.

As described above, the second layer 182 covers the partition wall 172 and possesses a flat top surface in the region overlapping with the light-emitting element 126 and the partition wall 172 in the display region 108. The formation of the second layer 182 with such a large thickness effectively prevents the entrance of the impurities such as water and oxygen. For example, a schematic diagram of a case where a foreign object 190 remains over the first electrode 170 of the light-emitting element 126 during manufacture of the display device 100 is illustrated in FIG. 3A. In this case, the first layer 180 of the passivation film 178 may be disconnected with the foreign object 190. However, the second layer 182 formed later is capable of completely covering the foreign object 190, giving a flat top surface. Accordingly, the third layer 184 formed over the second layer 182 can possess a uniform thickness and sufficiently cover the second layer 182. As a result, the entrance of the impurities from the top surface of the display device 100 can be effectively prevented.

Figure 3B:
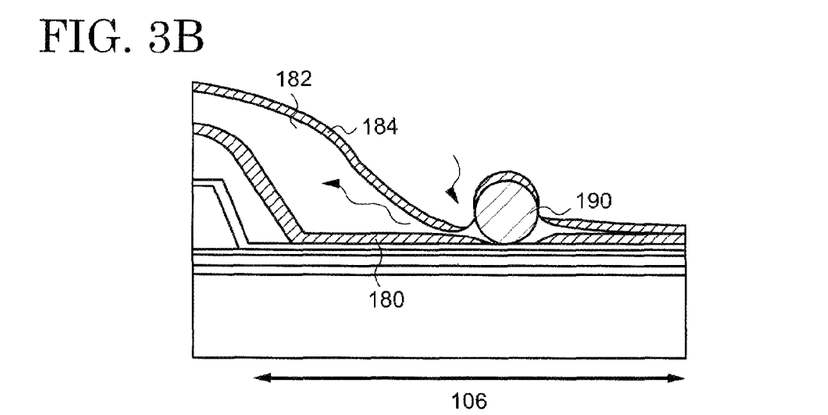

On the other hand, as shown in FIG. 2, the first layer 180 and the third layer 184 which contain an inorganic compound with low permeability and affinity to the impurities are in contact with each other in the second region 106, and the second layer 182 which includes an organic compound with relatively high permeability and affinity to the impurities does not exist at the edge portion of the display device 100. Hence, entrance of the impurities from the edge of the display device 100 can be effectively prevented. However, the thickness of the second layer 182 in a vicinity of the substrate 102 in the second region 106 is smaller than that in the first region 104. Hence, as shown in FIG. 3B, in the case where the foreign object 190 is left in the second region 106 in the manufacturing process, the foreign object 190 may not be able to be covered with the second layer 182. In this case, the second layer 182 is not completely covered with the third layer 184, which eventually leads to the formation of a pinhole in the third layer 184. Such a defect in the passivation film 178 permits the second layer 182 to serve as a diffusion path of the impurities as shown by an arrow in the drawing. As a result, the impurities are gradually diffused to the display region 108, and the dark spot expands from an edge portion of the display region 108.

As described above, since the diffusion rate of the impurities is not necessarily high, it is difficult to detect the dark spot immediately after the fabrication of the display device 100, and the dark spot may be observed after driving for several days or several months. In this case, the display device is recognized as a defective product for the first time after a user purchases an electronic device including the display device.

Figure 3C:
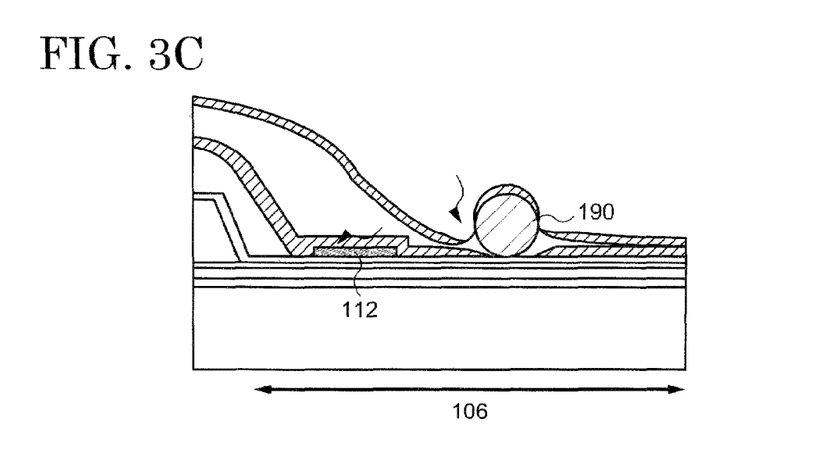

However, in the display device 100 of the present embodiment, the metal films 112 including a Group 1 metal element or a Group 2 element are arranged in the second region 106 which is closer to the edge portion of the substrate 102 than to the display region 108 (FIG. 3C). Such metal films react with the impurities such as water and oxygen and are tarnished, resulting in a color change. Thus, the entrance of the impurities to the edge portion of the substrate 102 can be immediately and readily detected in a quality test by observing with the naked eye or an optical microscope. This feature makes it possible to achieve early detection of a detective product, prevent shipping of a detective product, and supply a display device with improved reliability to a user.

Second Embodiment

In the present embodiment, a manufacturing method of the display device 100 described in the First Embodiment is explained by using FIG. 4A to 8B. Descriptions which are the same as that of the First Embodiment may be omitted. FIG. 4A to FIG. 8B are schematic cross-sectional views of the display device 100 along dotted line A-B in FIG. 1.

Figure 4A:
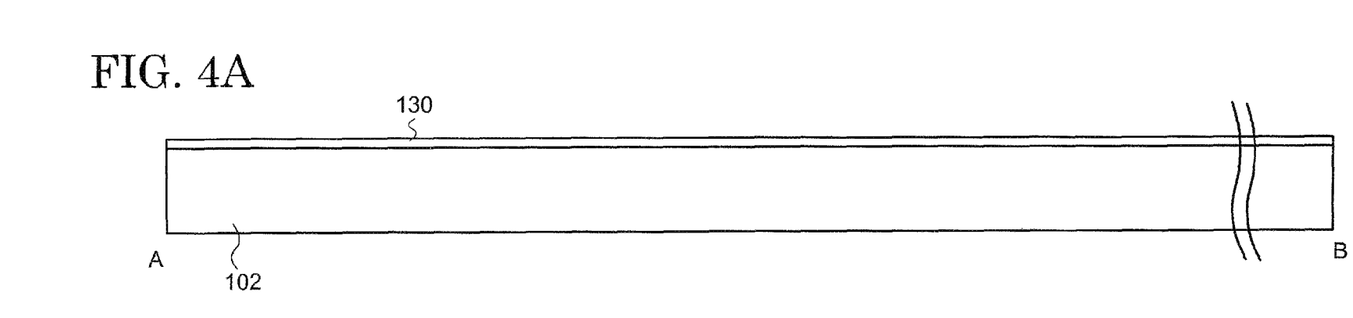
FIG. 4A and FIG. 4B are cross-sectional views showing a manufacturing method of a display device according to an embodiment.

As shown in FIG. 4A, the undercoat 130 is first formed over the substrate 102. The substrate 102 has a function to support a variety of elements formed thereover. Therefore, it is possible to use a material having physical strength sufficient to support these elements, heat resistance to the process for the fabrication of the elements, and chemical stability to the chemicals used in the process. Specifically, the substrate 102 can include glass, quartz, plastics, a metal, ceramics, and the like. When flexibility is provided to the display device 100, a material including plastics can be used, and a polymer material such as a polyimide, a polyamide, a polyester, and a polycarbonate can be employed.

The undercoat 130 is a film having a function to prevent diffusion of impurities from the substrate 102 to the semiconductor films 132, 134, and 136 and the like, includes an inorganic compound such as silicon nitride, silicon oxide, silicon nitride oxide, and silicon oxynitride, and can be formed by applying a chemical vapor deposition method (CVD method), a sputtering method, and the like.

The transistors 120, 122, and 124 are fabricated over the undercoat 130. The semiconductor films 132, 134, and 136 included in the transistors 120, 122, and 124 contain a material exhibiting semiconductor properties, such as silicon, germanium, or an oxide semiconductor and may be formed by utilizing a CVD method, a sputtering method, and the like. There is no limitation to crystallinity of the semiconductor films 132, 134, and 136, and the semiconductor films 132, 134, and 136 may have single crystalline, polycrystalline, microcrystalline, or amorphous morphology.

Figure 4B:
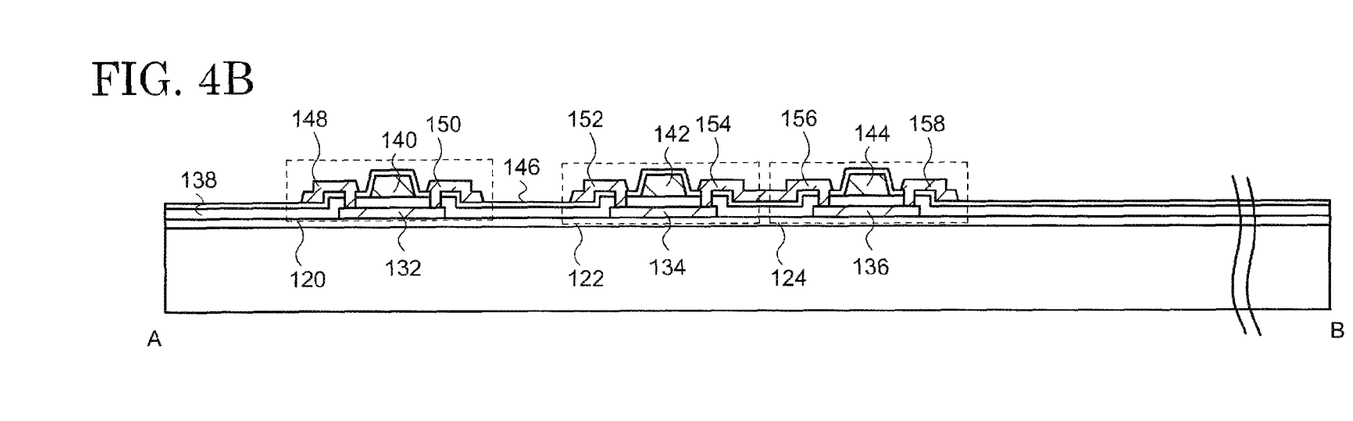

The gate insulating film 138 is formed over the semiconductor films 132, 134, and 136, and the gate electrodes 140, 142, and 144 are formed thereover (FIG. 4B). The gate insulating film 138 also includes a material which is the same as or similar to that of the undercoat 130 and can be prepared with a formation method which is the same as or similar to that of the undercoat 130. The gate insulating film 138 preferably contains silicon oxide. The undercoat 130 and the gate insulating film 138 each may have a single-layer structure or a stacked-layer structure having a plurality of layers. In FIG. 4A and FIG. 4B, the undercoat 130 and the gate insulating film 138 each are illustrated so as to have a single-layer structure. The gate electrodes 140, 142, and 144 include a metal such as titanium, aluminum, copper, molybdenum, tungsten, and tantalum or an alloy thereof and can be formed as a single layer or stacked-layer structure. For example, a stacked-structure in which a metal having high conductivity, such as aluminum and copper, is sandwiched by a metal with a high melting point, such as titanium and molybdenum, can be employed. As a formation method of the gate electrodes 140, 142, and 144, a sputtering method, a CVD method, a printing method, and the like are represented.

After the formation of the gate electrodes 140, 142, and 144, the interlayer film 146 is formed. The interlayer film 146 includes a material which is the same as or similar to that of the undercoat 130 and can be formed by using a formation method which is the same as or similar to that of the undercoat 130. The interlayer film 146 preferably includes silicon nitride. The film interlayer 146 may have a single-layer structure or may be structured with a plurality of layers. For example, the interlayer film 146 can be formed by stacking a film including silicon nitride and a film including silicon oxide.

Next, the openings reaching the semiconductor films 132, 134, and 136 are formed in the interlayer film 146 and the gate insulating film 138, and the source/drain electrodes 148, 150, 152, 154, 156, and 158 are formed therein. The source/drain electrodes 148, 150, 152, 154, 156, and 158 can include a material usable in the gate electrodes 140, 142, and 144 and can be formed with a CVD method or a sputtering method. Note that the source and drain of the transistors 120, 122, and 124 may be interchanged depending on the direction of current or a polarity of the transistors.

Figure 5A:
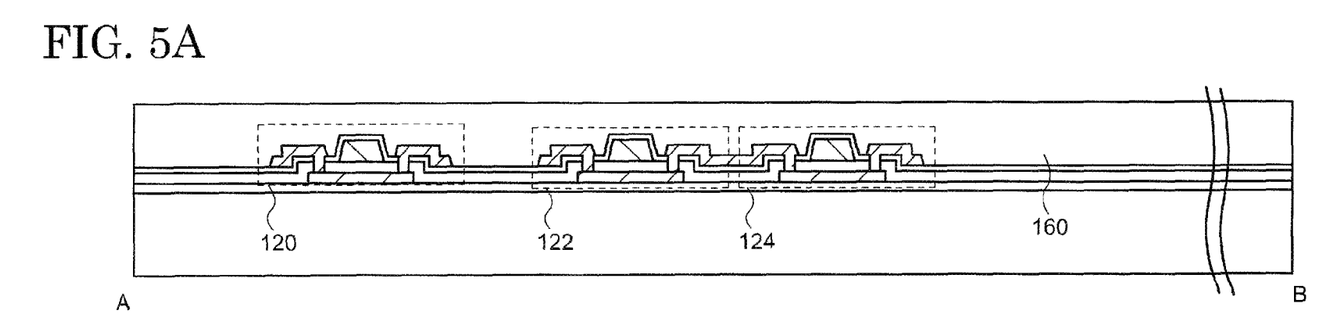
FIG. 5A to FIG. 5C are cross-sectional views showing a manufacturing method of a display device according to an embodiment.

Next, the leveling film 160 is formed so as to cover the transistors 120, 122, and 124 (FIG. 5A). The leveling film 160 is an insulating film and preferably includes a polymer material such as an epoxy resin, an acrylic resin, a polyester, a polyamide, a polyimide, and a polysiloxane. The leveling film 160 can be formed by a wet-type film-formation method such as a spin-coating method, an ink-jet method, a printing method, and a dip-coating method or a lamination method. The formation of the leveling film 160 enables it to absorb depressions, projections, and slopes caused by the transistors 120, 122, and 124, giving a flat top surface.

Figure 5B:
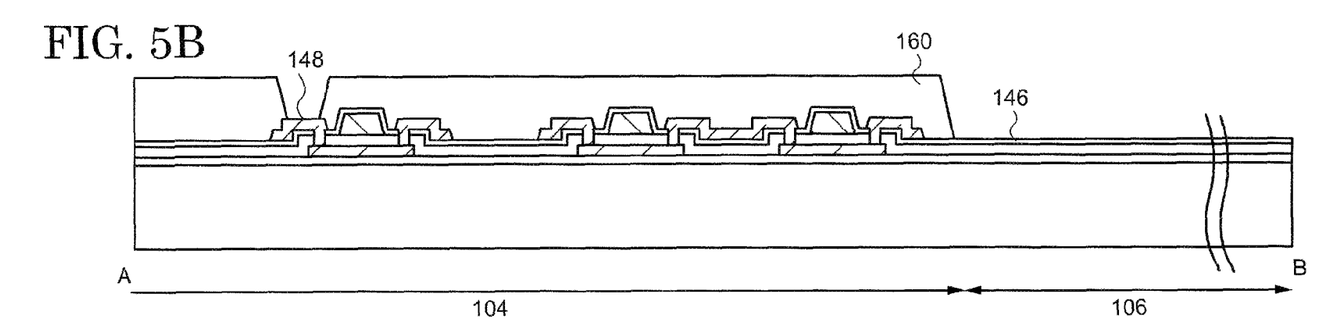

Next, the leveling film 160 is subjected to etching to form the opening portion reaching the source/drain electrode 148. At this time, the leveling film 160 over the second region 106 is removed to expose the interlayer film 146 (FIG. 5B). The etching may be wet etching or dry etching.

Figure 5C:
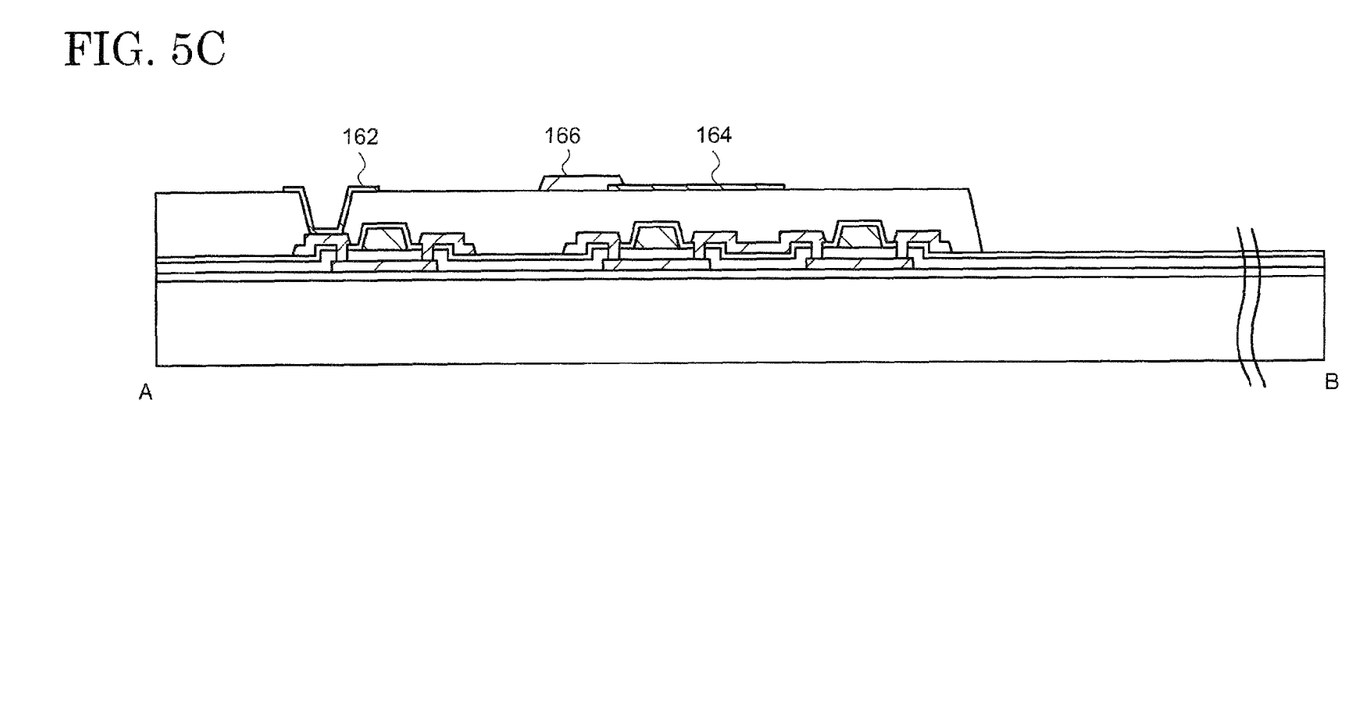

Next, the connection electrode 162 is formed so as to cover the opening portion, and the power source line 164 is formed over the leveling film 160 (FIG. 5C). These elements include a metal usable in the gate electrodes 140, 142, and 144 or a conductive oxide such as indium-tin oxide (ITO) and indium-zinc oxide (IZO) and can be formed by applying a sputtering method, a CVD method, and the like. The power source line 164 and the connection electrode 162 can be formed simultaneously, and therefore, can exist in the same layer. The formation of the connection electrode 162 allows the source/drain electrode 148 to be protected when the auxiliary electrode 166 is prepared, by which an increase in contact resistance can be prevented.

As an optional process, the auxiliary electrode 166 electrically connected to the power source line 164 may be formed (FIG. 5C). The auxiliary electrode 166 may also be formed with a material and a formation method applicable to the gate electrodes 140, 142, and 144.

Figure 6A:
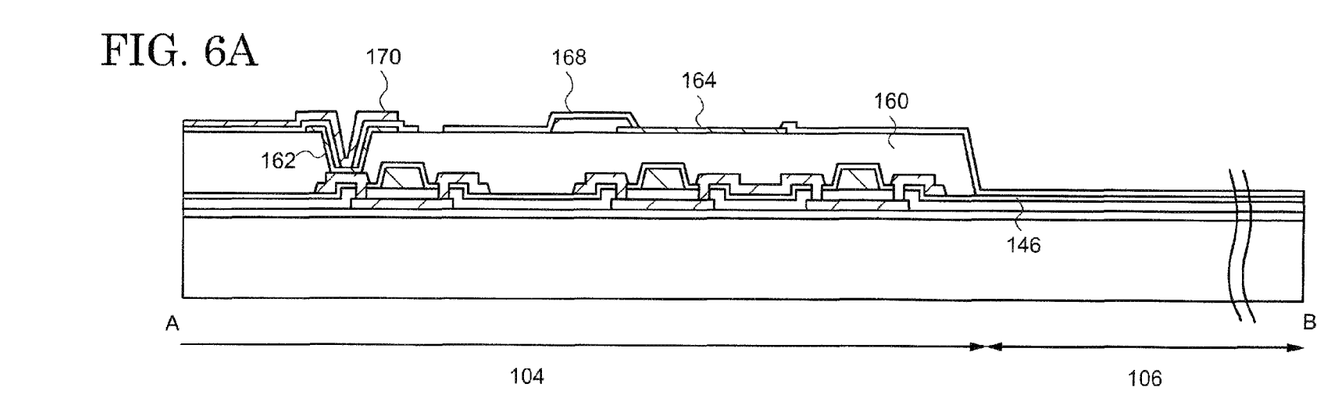
FIG. 6A and FIG. 6B are cross-sectional views showing a manufacturing method of a display device according to an embodiment.

Next, the protection film 168 is formed (FIG. 6A). The protection film 168 is an insulating film including silicon nitride and the like and can be prepared by using a material usable for the gate insulating film 138 and the interlayer film 146. The protection film 168 possesses opening portions which expose a contact portion (i.e., a bottom surface of the connection electrode 162) for electrical connection between the transistor 120 and the light-emitting element 126, a part of the power source line 164, and a part of the surface of the leveling film 160. Furthermore, the interlayer film 146 is in contact with the protection film 168 in the second region 106.

Next, the first electrode 170 of the light-emitting element 126 is formed (FIG. 6A). When the light-emission from the light-emitting element 126 is extracted through the substrate 102, a material with a light-transmitting property, such as ITO and IZO, can be used for the first electrode 170. On the other hand, when the light-emission from the light-emitting element 126 is extracted from a side opposite to the substrate 102, a metal such as aluminum and silver or an alloy thereof can be used. Alternatively, it is possible to employ stacked layers of the aforementioned metal or an alloy with a conductive oxide, such as a stacked-layer structure in which a metal is sandwiched by a conductive oxide (e.g., ITO/silver/ITO).

Figure 6B:
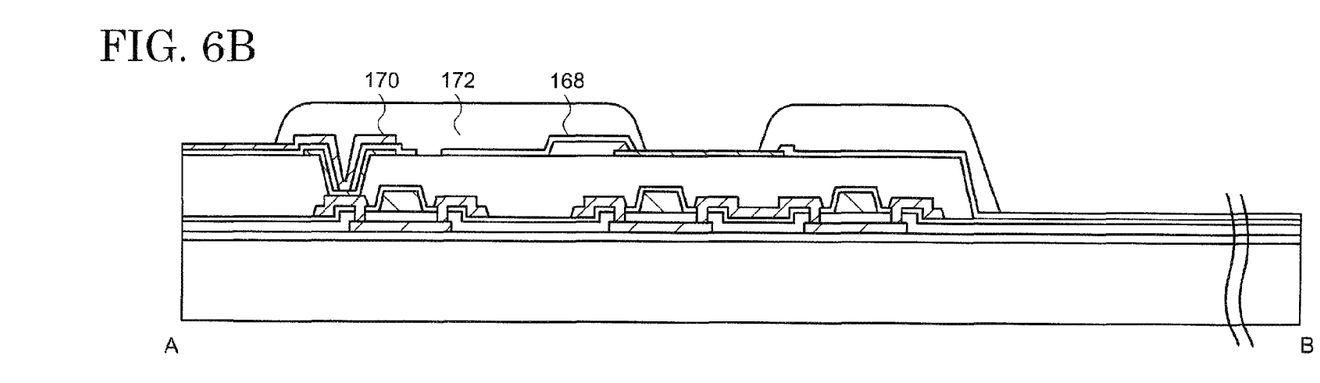

After forming the first electrode 170, the partition wall 172 is formed (FIG. 6B). The partition wall 172 has a function to absorb steps and slopes caused by the edge portion of the first electrode 170 and the opening portion provided in the leveling film 160. Although not shown, the partition wall 172 possesses a function to electrically insulate the first electrodes 170 of the adjacent pixels 110 from each other. The partition wall 172 is also called a bank (rib). The partition wall 172 can be prepared with a material usable in the leveling film 160. The partition wall 172 has the opening portions so as to expose the first electrode 170 and a part of the power source line 164, and it is preferred that an opening edge have a moderate taper shape. A steep slope of the opening edge with respect to the first electrode 170 tends to cause a coverage defect of the EL layer 174 and the second electrode 176 formed later.

Figure 7A:
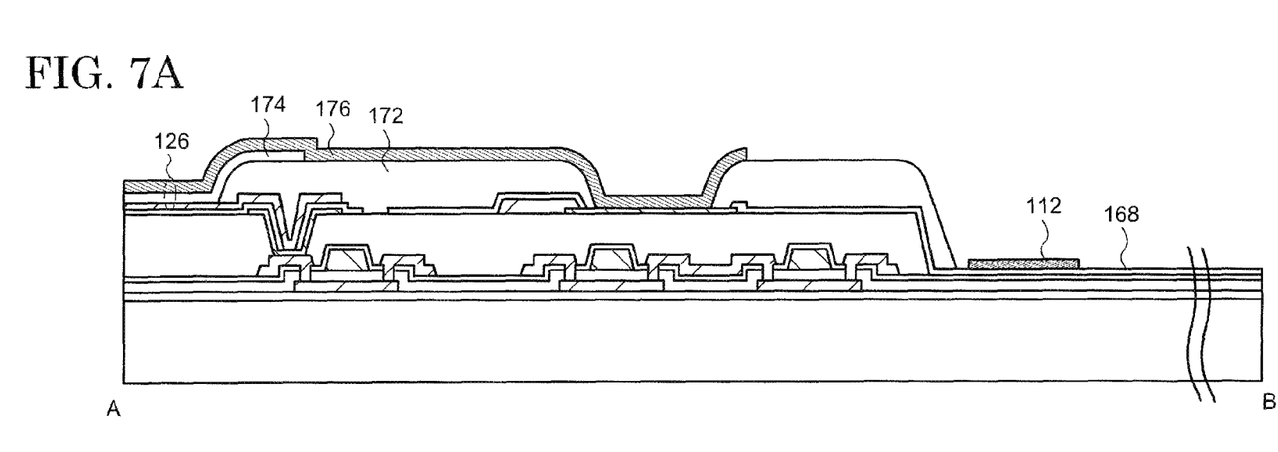
FIG. 7A and FIG. 7B are cross-sectional views showing a manufacturing method of a display device according to an embodiment.

After forming the partition wall 172, the EL layer 174 of the light-emitting element 126 is formed over the first electrode 170 and the partition wall 172 (FIG. 7A). As described above, the EL layer 174 may have a plurality of layers. The EL layer 174 can be formed with an evaporation method, an ink-jet method, a printing method, a spin-coating method, and the like.

After the formation of the EL layer 174, the second electrode 176 and the metal films 112 are formed. The second electrode 176 and the metal films 112 can be formed simultaneously. Therefore, the second electrode 176 and the metal films 112 can exist in the same layer. The second electrode 176 is disposed so as to be in contact with the EL layer 174 and a part of the partition wall 172, and the metal films 112 are arranged so as to be in contact with the protection film 168 in the second region 106. The second electrode 176 and the metal films 112 can be formed by using Group 1 metal elements or Group 2 elements of the periodic table with a sputtering method and the like. For example, magnesium, calcium, an alloy of magnesium and silver, an alloy of magnesium and aluminum can be utilized for the second electrode 176.

Note that the second electrode 176 and the metal films 112 may be formed in different steps. In this case, the second electrode 176 may be formed with a material other than the aforementioned materials. For example, when the light-emission from the light-emitting element 126 is extracted through the substrate 102, a metal such as aluminum and silver or an alloy thereof can be used for the second electrode 176. On the contrary, when the light-emission from the light-emitting element 126 is extracted through the second electrode 176, the second electrode 176 is formed by using the aforementioned metal or alloy so as to have a thickness which permits visible light to pass therethrough. Alternatively, a material having a light-transmitting property, such as a conductive oxide exemplified by ITO and IZO, can be used for the second electrode 176. Moreover, it is possible to employ a stacked-layer structure of the aforementioned metal or an alloy with a conductive oxide (e.g., Mg—Ag/ITO and the like) for the second electrode 176.

The light-emitting element 126 is formed with the first electrode 170, the EL layer 174, and the second electrode 176. Carriers (electrons and holes) are injected from the first electrode 170 and the second electrode 176, and the light-emission is obtained through a relaxation process of an excited state obtained by recombination of the carriers to a ground state. A region of the light-emitting element 126, in which the EL layer 174 and the first electrode 170 are in direct contact with each other, is an emission region of each pixel 110.

Figure 7B:
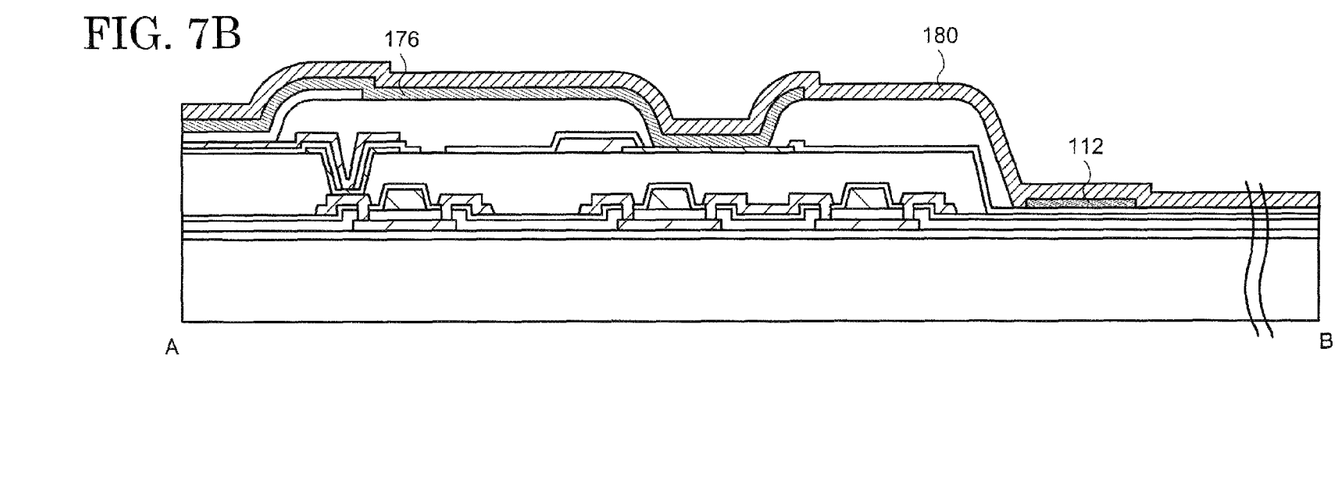

Next, the passivation film 178 for protecting the light-emitting element 126 is formed. Specifically, as shown in FIG. 7B, the first layer 180 is first formed over the second electrode 176. Hence, the first layer 180 can contact with the second electrode 176. The first layer 180 can include, for example, an inorganic compound such as silicon nitride, silicon oxide, silicon nitride oxide, and silicon oxynitride and can be formed by applying a CVD method or a sputtering method. The first layer 180 preferably includes silicon nitride. As shown in FIG. 7B, the first layer 180 can be formed over the whole of the substrate 102. Therefore, the first layer 180 overlaps with the partition wall 172 and is in contact with the metal films 112 in the second region 106.

Figure 8A:
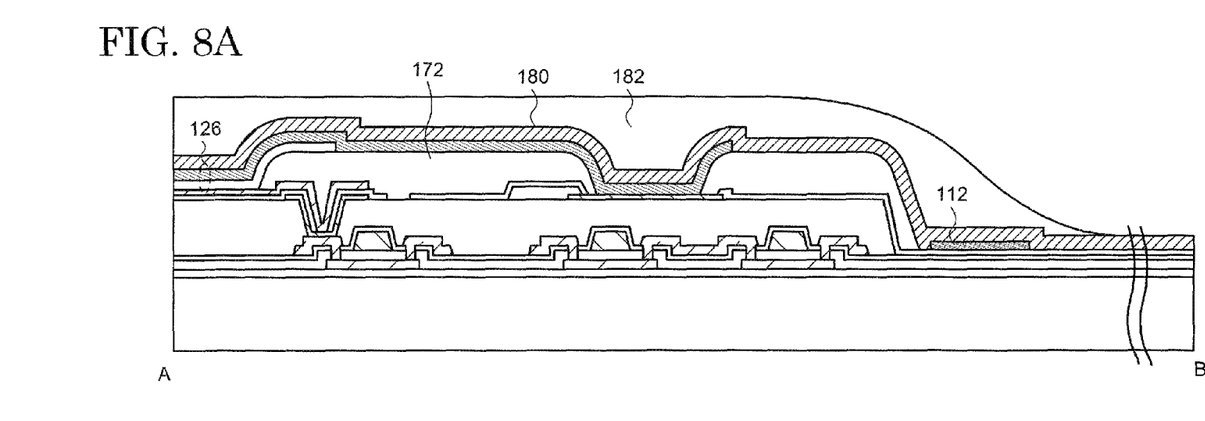
FIG. 8A and FIG. 8B are cross-sectional views showing a manufacturing method of a display device according to an embodiment.

Next, the second layer 182 is formed over the first layer 180 (FIG. 8A). The second layer 182 may contain a polymer material such as an epoxy resin, an acrylic resin, a polyimide, a polyester, and a polycarbonate. The second layer 182 can be formed with the aforementioned wet-type film-formation method among which an ink-jet method is preferred. Alternatively, the second layer 182 may be formed by atomizing or gasifying oligomers serving as a raw material of the aforementioned polymer material under vacuum, spraying the substrate 102 with the atomized or gasified oligomers, and then polymerizing the oligomers. In this case, a polymerization initiator may be mixed in the oligomers. Furthermore, the substrate 102 may be sprayed with the oligomers while cooling the substrate 102.

As shown in FIG. 8A, it is preferred that the second layer 182 be formed so as to absorb the depressions and projections caused by the partition wall 172. That is, it is preferred to form the second layer 182 so as to absorb the slopes, depressions, and projections in the plane of the first layer 180, to cover the partition wall 172, and to have a flat top surface in a region overlapping with the light-emitting element 126 and the partition wall 172. The specific thickness thereof is described in the First Embodiment. This structure allows the second layer 182 to possess a flat top surface which continues from the region overlapping with the light-emitting element 126 to the region overlapping with the partition wall 172. Note that, as shown in FIG. 1, the second layer 182 is formed from the first region 104 to a region between the plurality of metal films 112 and the edge portion of the substrate 102.

Figure 8B:
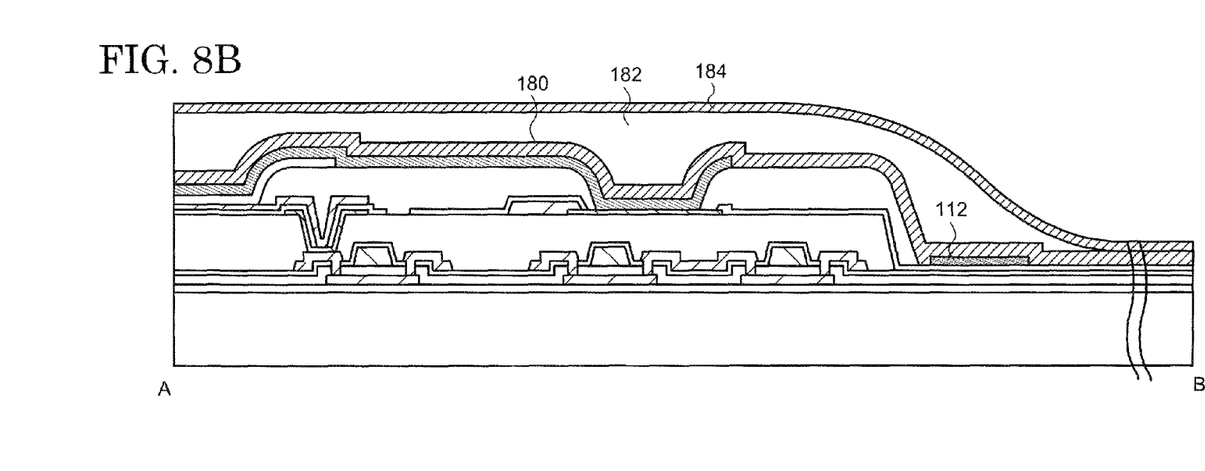

Next, the third layer 184 is formed over the second layer 182 (FIG. 8B). The third layer 184 may include a material usable in the first layer 180 and may be formed with a method which is the same or similar to that of the first layer 180. The second layer 182 is formed so that the top surface thereof is flat, by which the third layer 184 having a uniform thickness and sufficiently covering the second layer 182 can be formed.

Through the aforementioned steps, the display device 100 can be manufactured. Although not shown, a color filter, a light-shielding film, a substrate (opposing substrate) facing the substrate 102, and the like may be disposed over the passivation film 178. When an opposing substrate is provided, a space between the substrate 102 and the opposing substrate may be filled with an organic resin as a filler or an inert gas.

Third Embodiment

Figure 9:
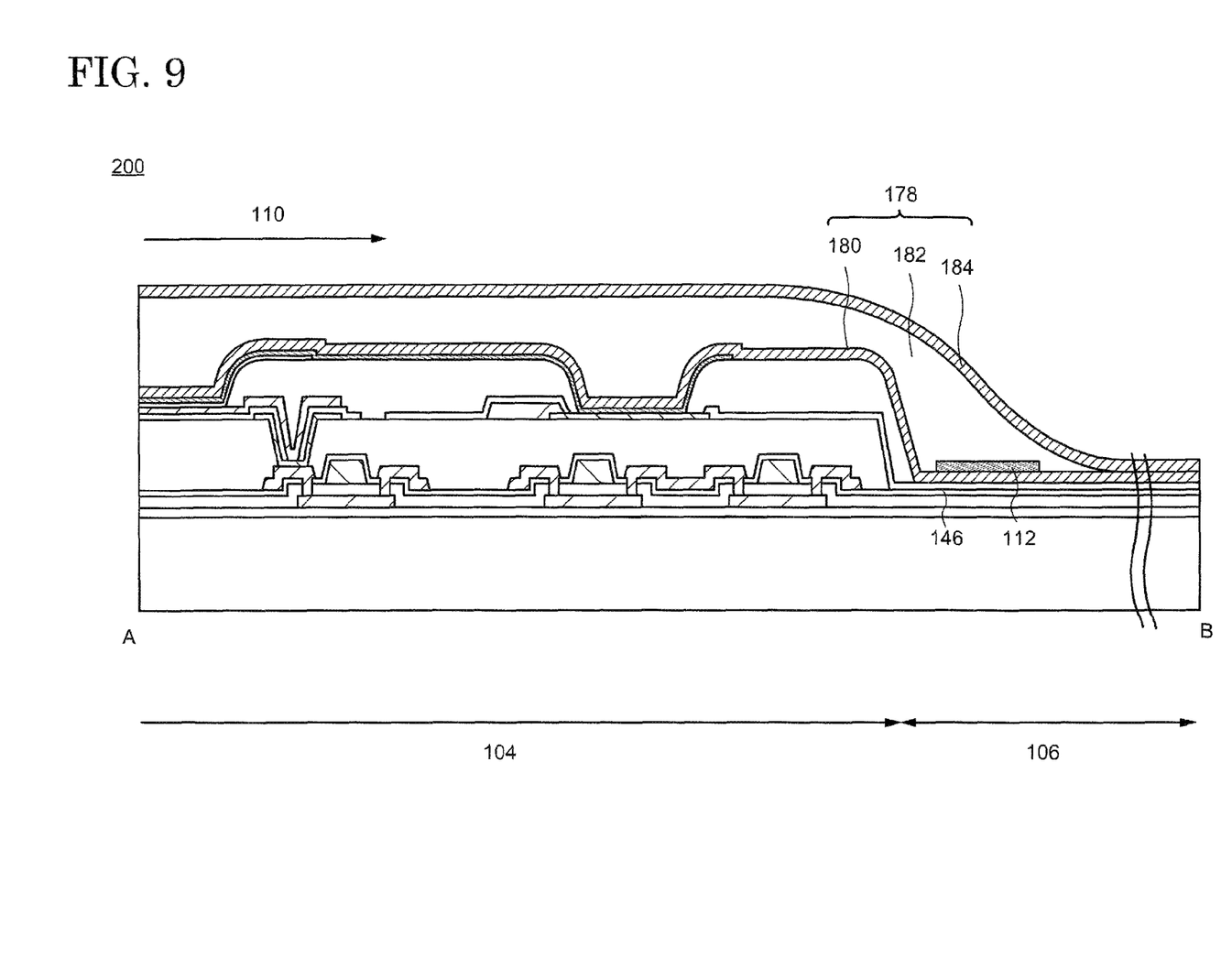
FIG. 9 is a schematic cross-sectional view of a display device according to an embodiment.
Figure 10:
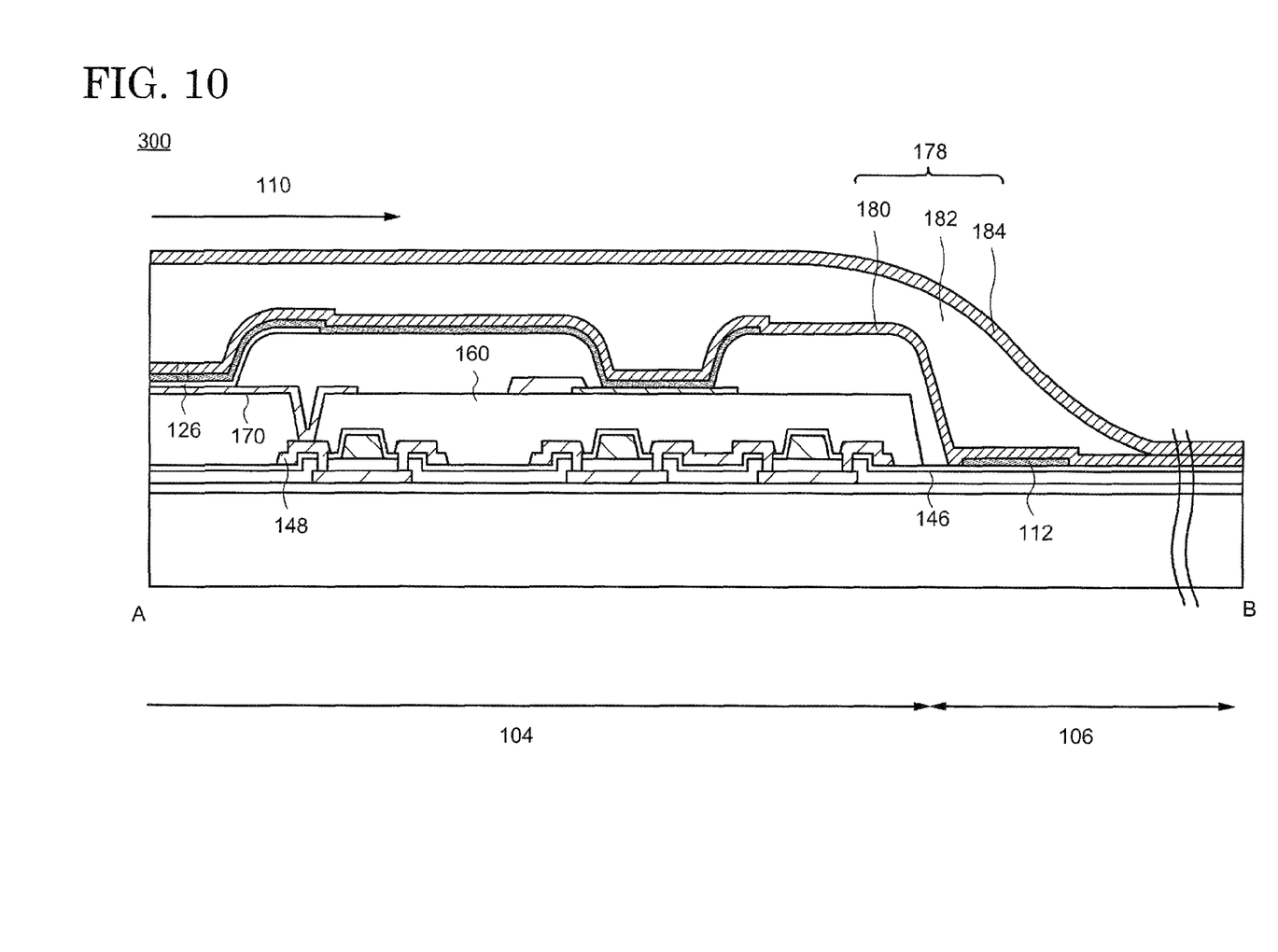
FIG. 10 is a schematic cross-sectional view of a display device according to an embodiment.
Figure 11:
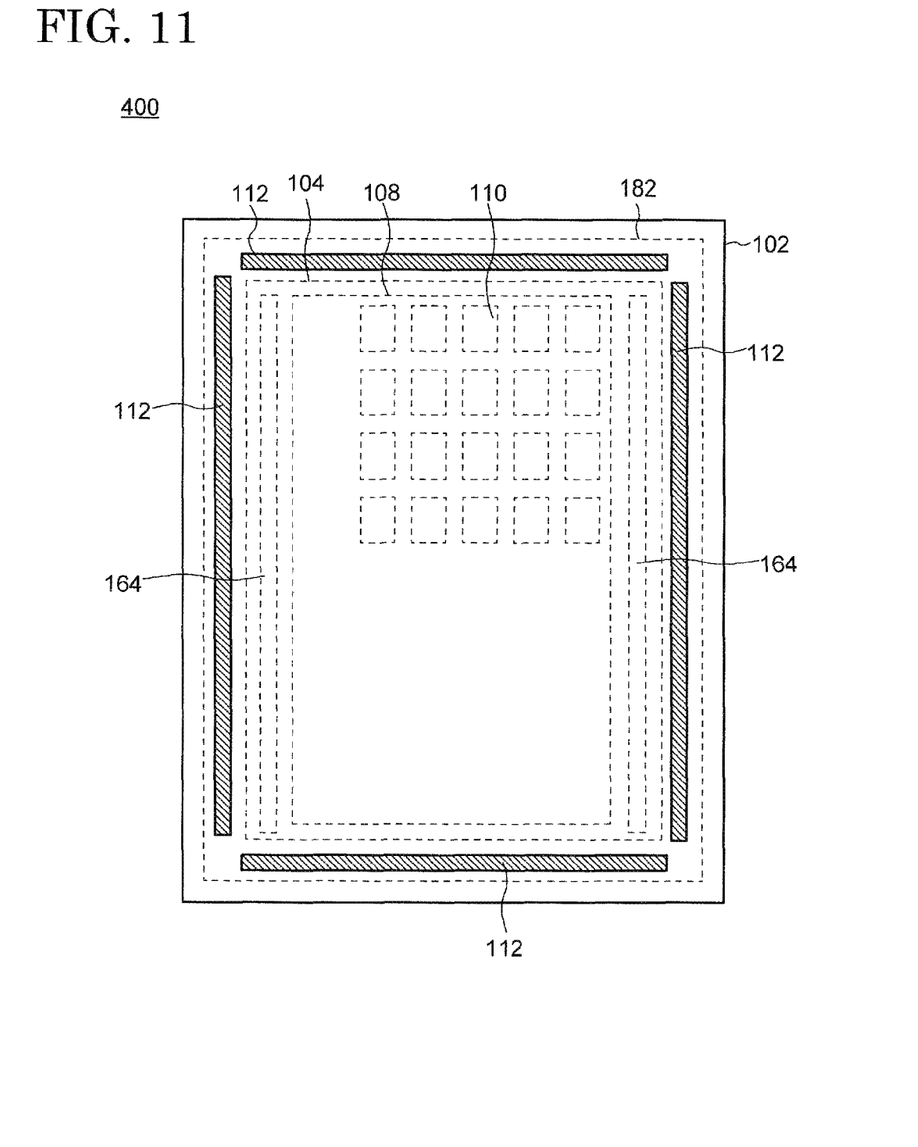
FIG. 11 is a schematic top view of a display device according to an embodiment.

In the present embodiment, display devices 200, 300, and 400 which are different from that of the First Embodiment are explained by using FIG. 9 to FIG. 11. FIG. 9 and FIG. 10 are schematic cross-sectional views of the display device 100 along dotted line A-B of FIG. 1, and FIG. 11 is a schematic top view of the display device 400. The structures which are the same as those of the First and Second Embodiments may be omitted.

Apart from the display device 100, the plurality of metal films 112 of the display device 200 shown in FIG. 9 are provided over the first layer 180 of the passivation film 178. Therefore, the second layer 182 and the metal films 112 are in contact with each other. Employment of such a structure enables rapider detection of impurities entering from an edge portion of the display device 200, by which shipping of a detective product can be effectively prevented.

Apart from the display devices 100 and 200, the protection film 168 of the display device 300 shown in FIG. 10 is not arranged over the leveling film 160, and the plurality of metal films 112 contact with the interlayer film 146 in the second region 106. Moreover, the first electrode 170 of the light-emitting element 126 is in contact with the source/drain electrode 148 in the opening portion of the leveling film 160. The use of such a structure reduces the number of masks in the manufacturing process, allowing the production of a display device at a lower cost.

Apart from the display device 100, the display device 400 shown in FIG. 11 possesses one metal film 112 in every side of the rectangular first region 104. Each of the metal films 112 extends in a direction parallel to the long side or the short side of the first region 104, and the metal films 112 are separated from one another. Compared with the display device 100, a total area of the metal films 112 is large, and an area between the adjacent metal films 112 is relatively small. Hence, it is possible to more accurately monitor the entrance of the impurities.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:
1. A display device comprising:
   a substrate comprising:
      a first region including:
         a transistor;
         a leveling film over the transistor and arranged so as to be confined in the first region; and
         a light-emitting element over the leveling film and electrically connected to the transistor; and a second region adjacent to the first region, the second region being located in a direction from the first region to an outside of the substrate;
a plurality of metal films in the second region, the plurality of metal films including at least one of a Group 1 metal element and Group 2 element; and
a sealing film over the light-emitting element and the plurality of metal films, the sealing film comprising:
a first layer including an inorganic compound;
a second layer over the first layer, the second layer including an organic compound; and
a third layer over the second layer, the third layer including an inorganic compound.

2. The display device according to claim 1,
wherein a first metal film and a second metal film selected from the plurality of metal films, sandwich the first region and extend in a first direction parallel to a long side or a short side of the substrate, and
wherein a third metal film and a fourth metal film selected from the plurality of metal films, sandwich the first region and extend in a second direction different from the first direction.

3. The display device according to claim 2,
wherein the second direction is perpendicular to the first direction.

4. The display device according to claim 1,
wherein the light-emitting element comprises:
a first electrode;
an EL layer over the first electrode; and
a second electrode over the EL layer, and
wherein the second electrode and the plurality of metal films exist in the same layer.

5. The display device according to claim 4, further comprising a partition wall covering an edge portion of the first electrode,
wherein a top surface of the second layer is flat in a region overlapping with the light-emitting element and the partition wall.

6. The display device according to claim 1,
wherein a top surface of the second layer slopes from the first region to the second region.

7. The display device according to claim 6,
wherein the first layer is in contact with the third layer in the second region.

8. The display device according to claim 1,
wherein the plurality of metal films is arranged so as to form an outline surrounding the first region, and
wherein the leveling film is arranged so as to be confined in the outline.

9. The display device according to claim 1,
wherein the second region surrounds the first region.

10. The display device according to claim 1, further comprising a driver circuit in the first region.

11. The display device according to claim 1,
wherein the plurality of metal films does not overlap with the leveling film.

12. The display device according to claim 1,
wherein the first layer is in contact with the plurality of metal films.

13. The display device according to claim 1, further comprising a first insulating film between a gate electrode of the transistor and the leveling film,
wherein the plurality of metal films is in contact with the first insulating film.

14. The display device according to claim 1, further comprising a second insulating film between the leveling film and the light-emitting element,
wherein the plurality of metal films is in contact with the second insulating film.

15. The display device according to claim 1,
wherein the plurality of metal films includes a Group 2 element.

16. The display device according to claim 1,
wherein the plurality of metal films includes magnesium, calcium, or barium.

17. A display device comprising:
a substrate comprising:
a first region including:
a transistor;
a leveling film over the transistor and arranged so as to be confined in the first region; and
a light-emitting element over the leveling film and electrically connected to the transistor; and
a second region adjacent to the first region, the second region being located in a direction from the first region to an outside of the substrate;
a first layer over the light-emitting element and the second region, the first layer including an inorganic compound;
a plurality of metal films located over the first layer in the second region, the plurality of metal films including one of a Group 1 metal element and Group 2 element;
a second layer over the first layer and the plurality of metal films, the second layer including an organic compound; and
a third layer over the second layer, the third layer including an inorganic compound.

* * * * *